(12) United States Patent
Tian et al.

(10) Patent No.: US 9,437,417 B2
(45) Date of Patent: Sep. 6, 2016

(54) LOW TEMPERATURE POLYCRYSTALLINE SILICON THIN FILM AND METHOD OF PRODUCING THE SAME, ARRAY SUBSTRATE AND DISPLAY APPARATUS

(71) Applicant: Boe Technology Group Co., Ltd., Beijing (CN)

(72) Inventors: Xueyan Tian, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/081,833

(22) Filed: Nov. 15, 2013

(65) Prior Publication Data
US 2014/0138695 A1    May 22, 2014

(30) Foreign Application Priority Data

Nov. 22, 2012   (CN) .......................... 2012 1 0478997

(51) Int. Cl.
| | |
|---|---|
| *H01L 21/31* | (2006.01) |
| *H01L 21/02* | (2006.01) |
| *H01L 29/66* | (2006.01) |
| *H01L 27/12* | (2006.01) |

(52) U.S. Cl.
CPC ... *H01L 21/02112* (2013.01); *H01L 21/02422* (2013.01); *H01L 21/02488* (2013.01); *H01L 21/02491* (2013.01); *H01L 21/02502* (2013.01); *H01L 21/02532* (2013.01); *H01L 21/02686* (2013.01); *H01L 29/66757* (2013.01); *H01L 27/1281* (2013.01)

(58) Field of Classification Search
CPC ................ H01L 29/66757; H01L 27/1281; H01L 21/02112; H01L 21/02488; H01L 21/02532; H01L 21/02422; H01L 21/02686; H01L 21/02502; H01L 21/02491
USPC .......................................... 438/778
See application file for complete search history.

(56) References Cited

U.S. PATENT DOCUMENTS

| | | |
|---|---|---|
| 5,851,862 A | 12/1998 | Ohtani et al. |
| 6,025,217 A | 2/2000 | Kanaya et al. |
| 2004/0130005 A1* | 7/2004 | Guzman et al. ............ 257/636 |
| 2005/0029518 A1* | 2/2005 | Kato et al. ................. 257/59 |

(Continued)

FOREIGN PATENT DOCUMENTS

| | | | |
|---|---|---|---|
| CN | 1604273 A | | 4/2005 |
| CN | 102655089 | * | 9/2012 |
| KR | 100275206 B1 | | 1/2001 |

OTHER PUBLICATIONS

Machine translated document (Sep. 5, 2012).*

(Continued)

*Primary Examiner* — A. Sefer
(74) *Attorney, Agent, or Firm* — Kinney & Lange, P.A.

(57) ABSTRACT

A method for producing a low temperature polycrystalline silicon thin film, comprising steps of: providing a substrate; forming a thermal conduction and electrical insulation layer, a buffer layer and an amorphous silicon layer on the substrate in this order; and performing a high-temperature treatment and a laser annealing on the amorphous silicon layer to convert the amorphous silicon layer to a polycrystalline silicon thin film, wherein the thermal conduction and electrical insulation layer comprises regular patterns distributed on the substrate.

10 Claims, 1 Drawing Sheet

(56) References Cited

U.S. PATENT DOCUMENTS

| | | |
|---|---|---|
| 2007/0155067 A1 | 7/2007 | Park et al. |
| 2007/0155139 A1* | 7/2007 | Hecht et al. .................. 438/486 |
| 2008/0032139 A1* | 2/2008 | Le Blevennec et al. ..... 428/446 |
| 2008/0131663 A1* | 6/2008 | Tanaka et al. ................ 428/141 |
| 2008/0179547 A1* | 7/2008 | Henley .................... 250/492.21 |
| 2009/0258465 A1* | 10/2009 | Chung .......................... 438/166 |
| 2010/0080977 A1* | 4/2010 | Chang et al. .............. 428/312.6 |

OTHER PUBLICATIONS

English translation of First Office Action issued Sep. 3, 2014, for CN 2012104789972.

* cited by examiner

LOW TEMPERATURE POLYCRYSTALLINE SILICON THIN FILM AND METHOD OF PRODUCING THE SAME, ARRAY SUBSTRATE AND DISPLAY APPARATUS

CROSS-REFERENCE TO RELATED APPLICATION

This application claims the benefit of Chinese Patent Application No. 201210478997.2 filed on Nov. 22, 2012 in the State Intellectual Property Office of China, the whole disclosure of which is incorporated herein by reference.

BACKGROUND OF THE INVENTION

1. Field of the Invention

The present invention relates to a display technical field, more particularly, relates to a method for producing a low temperature polycrystalline silicon thin film, a thin film transistor and a method for producing the thin film transistor, an array substrate, and a display apparatus.

2. Description of the Related Art

With a rapid development of a technology of flat-panel display, an Active Matrix Organic Light Emitting Diode (AMOLED) is going to be popular because it has many advantages, such as lightweight, thin thickness, self-luminousness, high response speed, etc. The AMOLED comprises an active switch, an insulation layer, a transparent electrode, a luminous layer and a metallic layer formed on a substrate in this order. The active switch is connected to the transparent electrode through a via to control writing of an image data. Currently, with the AMOLED becomes larger and larger in size, a Low Temperature Poly-silicon (polycrystalline silicon) Thin Film Transistor (LTPS-TFT) is often used as a pixel switch control element in the active switch. Accordingly, the quality of a low temperature polycrystalline silicon thin film for the LTPS-TFT has a direct influence on the electrical performance of the LTPS-TFT. As a result, there is an urgent need to improve the technology of producing the low temperature polycrystalline silicon thin film.

In prior arts, the method for producing the polycrystalline silicon thin film in a back panel of the AMOLED mainly comprises Excimer Laser Annealing (ELA), Solid Phase Crystallization (SPC), Metal-Induced Crystallization (MIC), and so on. However, so far, only the ELA is adapted to produce the polycrystalline silicon thin film of an active layer of TFT in the back panel in a large scale. FIG. 1 shows a process of producing the low temperature polycrystalline silicon thin film by the conventional ELA. As shown in FIG. 1, firstly, forming a buffer layer 103 and an amorphous silicon layer 104 on a glass substrate 101 in order, then performing a laser annealing on the amorphous silicon layer 104 with a laser beam 105, and then a polycrystalline silicon thin film having a thickness of 0.3 μm~0.5 μm may be resulted.

In the research of the ELA, researchers are all trying to develop a low temperature polycrystalline silicon having a large grain size so as to obtain a low temperature polycrystalline silicon thin film transistor with a high mobility. Unfortunately, so far, the researchers do not find a proper method to obtain the low temperature polycrystalline silicon having the large grain size yet, although the quality of the low temperature polycrystalline silicon thin film is related to many factors, such as, an output wavelength, a pulse width, an energy distribution and uniformity, an energy density and a pulse frequency of an Excimer Laser; a production method, a thickness, a dehydrogenation method and an annealing atmosphere of an original amorphous silicon film, etc.

SUMMARY OF THE INVENTION

The present invention has been made to overcome or alleviate at least one aspect of the above mentioned disadvantages.

Accordingly, it is an object of the present invention to provide a method for producing a low temperature polycrystalline silicon thin film having a large grain size.

According to an aspect of the present invention, there is provided a method for producing a low temperature polycrystalline silicon thin film, comprising:

providing a substrate;

forming a thermal conduction and electrical insulation layer, a buffer layer and an amorphous silicon layer on the substrate in this order; and performing a high-temperature treatment and a laser anneal on the amorphous silicon layer to convert the amorphous silicon layer to a polycrystalline silicon thin film, wherein the thermal conduction and electrical insulation layer comprises regular patterns distributed on the substrate.

In the above method, the thermal conduction and electrical insulation layer is made of any one of aluminum nitride, boron nitride, aluminum oxide, and magnesium oxide.

In the above method, the thermal conduction and electrical insulation layer comprises circular patterns, rectangular patterns or strip patterns evenly distributed on the substrate.

In the above method, the circular pattern, the rectangular pattern or the strip pattern has a size within a range of 0.1 μm~1 μm.

In the above method, the size of the circular pattern, the rectangular pattern or the strip pattern is 0.5 μm.

In the above method, the thermal conduction and electrical insulation layer is formed by spray coating, or by magnetron sputtering and exposure etching.

In the above method, said performing a high-temperature treatment and a laser anneal on the amorphous silicon layer to convert the amorphous silicon layer to a polycrystalline silicon thin film comprising:

performing a high-temperature treatment on the amorphous silicon layer at a temperature of 400~500° C. for a period of 0.5~3 hours; and performing an excimer laser anneal on the amorphous silicon layer processed by the high-temperature treatment with a laser having a pulse frequency of 300 Hz, an overlapping coefficient of 92%~98%, and an energy density of 200~500 mJ/cm$^2$.

According to another aspect of the present invention, there is provided a method for producing a thin film transistor (TFT), comprising:

forming a polycrystalline silicon thin film on a substrate, and forming an active layer of the TFT by patterning the polycrystalline silicon thin film, wherein the polycrystalline silicon thin film is produced by the above method for producing the low temperature polycrystalline silicon thin film.

The above method for producing the TFT further comprising:

forming a gate insulation layer, a gate electrode, an interlayer insulation layer, and a source electrode and a drain electrode above the active layer, wherein the source electrode and the drain electrode are connected to both ends of the active layer through via holes in the insulation layers, respectively.

In the above method for producing the TFT, said forming a gate insulation layer, a gate electrode, an interlayer insulation layer, and a source electrode and a drain electrode above the active layer comprising:

depositing a gate insulation layer on the active layer;

doping both ends of the active layer by masking to form ohmic contact zones at the both ends of the active layer;

forming a gate metallic film on the gate insulation layer, and forming a gate electrode by patterning the gate metallic film;

forming an interlayer insulation layer on the gate electrode, and forming via holes extending through the gate insulation layer and the interlayer insulation layer to expose the ohmic contact zones at the both ends of the active layer; and forming a source and drain metallic film on the interlayer insulation layer, and forming a source electrode and a drain electrode by patterning the source and drain metallic film, wherein the source electrode and the drain electrode are connected to the ohmic contact zones at the both ends of the active layer through the via holes in the insulation layers, respectively.

According to another aspect of the present invention, there is provided a thin film transistor produced by the above method for producing the TFT.

In the above thin film transistor, a buffer layer and a thermal conduction and electrical insulation layer are formed below the active layer of the thin film transistor.

According to another aspect of the present invention, there is provided an array substrate comprising the above thin film transistor.

According to another aspect of the present invention, there is provided a display apparatus comprising the above array substrate.

In various embodiments of the present invention, the patterned thermal conduction and electrical insulation layer on the substrate changes the thermal conductive condition of the amorphous silicon thin film, and there is a temperature gradient in the amorphous silicon thin film during performing the laser annealing process on the amorphous silicon thin film. In the laser annealing process, since heat can be quickly absorbed in an area having the patterns of the thermal conduction and electrical insulation layer, the amorphous silicon thin film is cooled quicker in the area with the patterns of the thermal conduction and electrical insulation layer than the other area without the patterns of the thermal conduction and electrical insulation layer, and crystal nucleus can be preformed in the area with the patterns of the thermal conduction and electrical insulation layer. After the laser annealing, the crystal nucleus can continue growing up to large-sized polycrystalline silicon grains and these large-sized polycrystalline silicon grains are evenly distributed. In this way, the method of the present invention can produce a high quality of polycrystalline silicon thin film with a large grain size, an even distribution and a low surface roughness, and it can effectively overcome the disadvantages in the prior arts, such as, a low mobility in the low temperature polycrystalline silicon display back panel, a large drain current, an uneven mobility and an uneven threshold voltage in the thin film transistor, etc.

BRIEF DESCRIPTION OF THE DRAWINGS

The above and other features of the present invention will become more apparent by describing in detail exemplary embodiments thereof with reference to the accompanying drawings, in which.

LIST OF REFERENCE NUMERALS OF DRAWINGS

Figure 1:
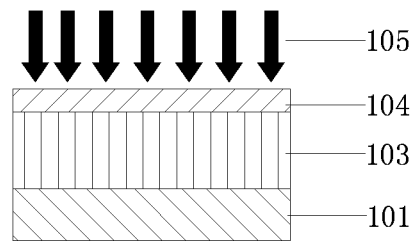
FIG. 1 is an illustrative view of a process for producing a low temperature polycrystalline silicon thin film by an Excimer Laser Annealing in prior arts.

101: glass substrate;
102: thermal conduction and electrical insulation layer;
103: buffer layer;
104: amorphous silicon layer;
105: laser beam.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

First Embodiment

Figure 2:
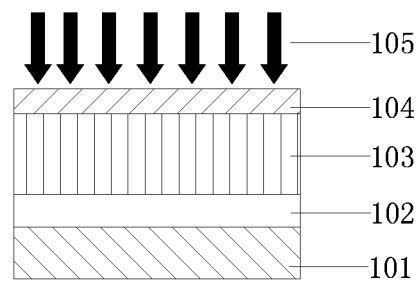
FIG. 2 is an illustrative view of a process for producing a low temperature polycrystalline silicon thin film by an Excimer Laser Annealing according to a first exemplary embodiment of the present invention.

The first embodiment of the present invention discloses a method for producing a low temperature polycrystalline silicon thin film. With reference to FIG. 2, the method comprising steps of:

(1) Providing a glass substrate 101 as a substrate;

The glass substrate 101 may be pre-cleaned. Furthermore, the substrate may be selected from a quartz substrate or any other transparent substrate in addition to the glass substrate 101.

(2) Forming a thermal conduction and electrical insulation layer 102 on the glass substrate 101;

The thermal conduction and electrical insulation layer 102 comprises regular patterns distributed on the substrate.

Particularly, in an exemplary embodiment of the present invention, an aluminum nitride film having a thickness of 400 nm is firstly produced by magnetron sputtering, and then the aluminum nitride film is processed by exposing and etching to form the regular patterns distributed on the substrate.

Figure 3:
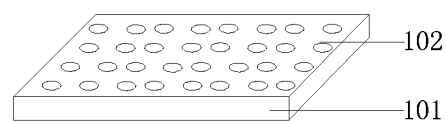
FIG. 3 is an illustrative structure view of a thermal conduction and electrical insulation layer comprising regular patterns according to the first exemplary embodiment of the present invention.

In an exemplary embodiment of the present invention, as shown in FIG. 3, the thermal conduction and electrical insulation layer 102 may comprise circular patterns, rectangular patterns or strip patterns evenly distributed on the substrate.

Furthermore, the circular pattern, the rectangular pattern or the strip pattern may have a size within a range of 0.1 µm~1 µm. Preferably, the size of the circular pattern, the rectangular pattern or the strip pattern may be set as 0.5 µm. In an exemplary embodiment, the size of the circular pattern may be referred to the diameter of the circular pattern, the size of the rectangular pattern may be referred to the diameter of an external tangent circle of the rectangular pattern, and the size of the strip pattern may be referred to the width of the strip pattern.

Furthermore, the thermal conduction and electrical insulation layer may be made of boron nitride, aluminum oxide or magnesium oxide in addition to the aluminum nitride, because the boron nitride, the aluminum oxide and the magnesium oxide also have a high thermal conduction and an electrical insulation performance.

Furthermore, the thermal conduction and electrical insulation layer 102 may be formed by spray coating, for example, by spray coating superfine aluminum nitride power produced by a combustion synthesis method and distributed relatively evenly.

(3) Depositing a buffer layer 103 and an amorphous silicon layer 104 on the thermal conduction and electrical insulation layer 102;

The buffer layer 103 having a thickness of 100~350 nm may be deposited on the thermal conduction and electrical insulation layer 102 by a method of Plasma Enhanced Chemical Vapor Deposition (PECVD). The buffer layer 103 may be made of a silicon dioxide film. After the buffer layer 103 is formed, the amorphous silicon layer 104 having a thickness of 30~60 nm may be deposited on the buffer layer 103.

(4) Performing a high-temperature treatment and a laser annealing on the amorphous silicon layer 104.

After the amorphous silicon layer 104 has been deposited, performing a high-temperature treatment on the amorphous silicon layer 104 at a temperature of 400~500° C. for a period of 0.5~3 hours to dehydrogenize the amorphous silicon layer 104. After the high-temperature treatment, performing an excimer laser annealing on the amorphous silicon layer 104 with laser beams 105 above the substrate to convert the amorphous silicon layer 104 to a polycrystalline silicon thin film.

In an exemplary embodiment of the present invention, the excimer laser for annealing the amorphous silicon layer 104 may be any one of a xenon chloride excimer laser, a krypton fluoride excimer laser and an argon fluoride excimer laser.

In an exemplary embodiment of the present invention, the excimer laser for annealing the amorphous silicon layer 104 is a xenon chloride excimer laser having a wavelength of 308 nm, a pulse frequency of 300 Hz, an overlapping coefficient of 92%~98%, and an energy density of 200~500 mJ/cm$^2$.

In this embodiment, by providing the patterned thermal conduction and electrical insulation layer 102 on the substrate, the thermal conductive condition of the amorphous silicon thin film is changed, and the growing condition of the polycrystalline silicon grains is changed, and a polycrystalline silicon thin film having an average grain size of about 0.6~1 micron is obtained. In addition, the patterns of thermal conduction and electrical insulation layer 102 are regularly and evenly distributed, therefore, the polycrystalline silicon grains are formed in an even distribution.

Second Embodiment

The second embodiment of the present invention discloses a method for producing a thin film transistor, comprising steps of:

forming a polycrystalline silicon thin film on a substrate, and forming an active layer of the TFT by patterning the polycrystalline silicon thin film; and forming a gate insulation layer, a gate electrode, an interlayer insulation layer, a source electrode and a drain electrode above the active layer, the source electrode and the drain electrode being connected to both ends of the active layer through via holes in the insulation layers, respectively, wherein the polycrystalline silicon thin film is produced by the method for producing the low temperature polycrystalline silicon thin film of the above first embodiment.

Said step of forming the gate insulation layer, the gate electrode, the interlayer insulation layer, the source electrode and the drain electrode above the active layer comprising steps of:

depositing a gate insulation layer on the active layer;

doping both ends of the active layer by masking to form ohmic contact zones at the both ends of the active layer;

forming a gate metallic film on the gate insulation layer, and forming a gate electrode by patterning the gate metallic film;

forming an interlayer insulation layer on the gate electrode, and forming via holes extending through the gate insulation layer and the interlayer insulation layer to expose the ohmic contact zones at the both ends of the active layer; and forming a source and drain metallic film on the interlayer insulation layer, and forming the source electrode and the drain electrode by patterning the source and drain metallic film, wherein the source electrode and the drain electrode are connected to the ohmic contact zones at the both ends of the active layer through the via holes in the insulation layers, respectively.

In the thin film transistor produced by the above method, the low temperature polycrystalline silicon thin film has a large grain size, an even distribution and a low surface roughness, and it can effectively overcome disadvantages in a thin film transistor produced by a conventional method, such as, a large drain current, an uneven mobility and an uneven threshold voltage, etc.

Third Embodiment

The third embodiment of the present invention provides a low temperature polycrystalline silicon thin film transistor produced by the method of the second embodiment.

In an exemplary embodiment, the buffer layer and the thermal conduction and electrical insulation layer are formed below the active layer of the thin film transistor.

In the thin film transistor, the low temperature polycrystalline silicon thin film has a large grain size, an even distribution and a low surface roughness, and it can effectively overcome disadvantages in a thin film transistor produced by a conventional method, such as, a large drain current, an uneven mobility and an uneven threshold voltage, etc.

Fourth Embodiment

The fourth embodiment of the present invention provides an array substrate comprising the thin film transistor of the third embodiment.

If the above array substrate is used in a display back panel, it can effectively overcome the disadvantages in a display back panel in the prior arts, such as, a low mobility of the display back panel, a large drain current, an uneven mobility and an uneven threshold voltage in the thin film transistor, etc.

The display back panel comprising the above array substrate of the present invention can be adapted to AMOLED, LTPS TFT-LCD, etc.

Fifth Embodiment

The fifth embodiment of the present invention provides a display apparatus comprising the array substrate of the fourth embodiment.

The display apparatus of the fifth embodiment may be AMOLED, LCD, etc.

The low temperature polycrystalline silicon thin film transistor used in the display apparatus has a stable electrical performance, therefore, the display quality of the display apparatus can be improved.

In various embodiments of the present invention, by providing the patterned thermal conduction and electrical insulation layer on the substrate, the thermal conductive condition of the amorphous silicon thin film is changed, and there is a temperature gradient in the amorphous silicon thin film during performing the laser annealing process on the amorphous silicon thin film. In the laser annealing process, since heat can be quickly absorbed in an area having the patterns of the thermal conduction and electrical insulation layer, the amorphous silicon thin film is cooled quicker in the area with the patterns of the thermal conduction and electrical insulation layer than the other area without the patterns of the thermal conduction and electrical insulation layer, and crystal nucleus can be preformed in the area with the patterns of the thermal conduction and electrical insulation layer. After the laser annealing, the crystal nucleus can continue growing up to large-sized polycrystalline silicon grains and these large-sized polycrystalline silicon grains are evenly distributed. In this way, the method of the present invention can produce a high quality of polycrystalline silicon thin film with a large grain size, an even distribution and a low surface roughness, and it can effectively overcome the disadvantages in the prior arts, such as, a low mobility in the low temperature polycrystalline silicon display back panel, a large drain current, an uneven mobility and an uneven threshold voltage in the thin film transistor, etc.

The low temperature polycrystalline silicon thin film produced by the method of the present invention may be formed as an active layer of a low temperature polycrystalline silicon thin film transistor, and can be adapted to AMOLED, LTPS TFT-LCD, etc.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method for producing a low temperature polycrystalline silicon thin film, comprising steps of:
    providing a substrate;
    forming a thermal conduction and electrical insulation layer, a buffer layer and an amorphous silicon layer on the substrate in this order; and
    performing a high-temperature treatment and a laser annealing on the amorphous silicon layer to convert the amorphous silicon layer to a polycrystalline silicon thin film,
    wherein the thermal conduction and electrical insulation layer comprises regular patterns distributed on the substrate, and
    wherein said step of performing the high-temperature treatment and the laser annealing on the amorphous silicon layer to convert the amorphous silicon layer to a polycrystalline silicon thin film comprising steps of:
        performing a high-temperature treatment on the amorphous silicon layer at a temperature of 400~500° C. for a period of 0.5~3 hours; and
        performing an excimer laser annealing on the amorphous silicon layer processed by the high-temperature treatment with a laser having a pulse frequency of 300 Hz, an overlapping coefficient of 92%~98%, and an energy density of 200~500 mJ/cm$^2$; and
    wherein during the laser annealing, the amorphous silicon thin film is cooled more quickly in a first area with the patterns of the thermal conduction and electrical insulation layer than a second area without the patterns of the thermal conduction and electrical insulation layer.

2. The method according to claim 1, wherein the thermal conduction and electrical insulation layer is made of any one of aluminum nitride, boron nitride, aluminum oxide, and magnesium oxide.

3. The method according to claim 1, wherein the thermal conduction and electrical insulation layer comprises circular patterns, rectangular patterns or strip patterns evenly distributed on the substrate.

4. The method according to claim 3, wherein the circular pattern, the rectangular pattern or the strip pattern has a size within a range of 0.1 µm~1 µm.

5. The method according to claim 4, wherein the size of the circular pattern, the rectangular pattern or the strip pattern is set as 0.5 µm.

6. The method according to claim 1, wherein the thermal conduction and electrical insulation layer is formed by spray coating, or by magnetron sputtering and exposure etching.

7. A thin film transistor, comprising an active layer formed by a polycrystalline silicon thin film, wherein the polycrystalline silicon thin film is produced by a method according to claim 1.

8. The thin film transistor according to claim 7, wherein the buffer layer and the thermal conduction and electrical insulation layer are formed below the active layer of the thin film transistor.

9. An array substrate comprising the thin film transistor according to claim claim 7.

10. A display apparatus comprising the array substrate according to claim 9.

* * * * *